United States Patent [19]

Karinthi et al.

[11] Patent Number: 5,543,127
[45] Date of Patent: Aug. 6, 1996

[54] DILUTE SOLUTION OF A HYDRIDE IN LIQUID NITROGEN

[75] Inventors: Pierre Karinthi, Jouy en Josas; Bernard Jamonet, Bourg de Peage, both of France

[73] Assignee: L'Air Liquide, Societe Anonyme pour l'Etude et l'Exploitation des Procedes Georges Claude, Paris Cedex, France

[21] Appl. No.: 205,307

[22] Filed: Mar. 3, 1994

[30] Foreign Application Priority Data

Mar. 10, 1993 [FR] France ............... 93 02760

[51] Int. Cl.$^6$ .............. C01B 6/00; C01B 6/10; C01B 25/00; C01B 33/04
[52] U.S. Cl. .............. 423/294; 423/299; 423/347; 423/645
[58] Field of Search ................ 423/299, 294, 423/347, 645

[56] References Cited

U.S. PATENT DOCUMENTS

| | | | |
|---|---|---|---|
| 3,577,220 | 5/1971 | Kuratomi et al. | 423/347 |
| 4,537,759 | 8/1985 | Walker et al. | 423/347 |
| 4,613,492 | 9/1986 | Winter | 423/359 |
| 4,780,298 | 10/1988 | Kowal | 423/359 |
| 4,814,154 | 3/1989 | Doernemann et al. | 423/299 |
| 5,333,461 | 8/1994 | Cobb | 62/20 |

FOREIGN PATENT DOCUMENTS

| | | |
|---|---|---|
| 770906 | 3/1957 | European Pat. Off. . |
| 0247555 | 12/1987 | European Pat. Off. . |
| 1530150 | 6/1968 | France . |
| 2278385 | 2/1976 | France . |
| 2653448 | 4/1991 | France . |
| 2668166 | 4/1992 | France . |
| 1505727 | 3/1978 | United Kingdom . |

OTHER PUBLICATIONS

Hackh's *Chemical Dictionary* (1969) by McGraw-Hill, Inc. p., 330 (Fourth Edition).

By A. Holleman et al., "Lehrbuch Der Anorganischen Chemie", 1958, p. 44, Berlin.

J. Falbe et al., "Rompp Chemie Lexikon" 1992, *Georg Thieme Verlag Stuttgart*, New York, 9th edition, pg. 4152 & 4153.

Hans–Jurgen Klockner et al., "Hochreines Monosilan fur Die Elektronikindustrie—Synthese, Reinigung und Chara–kterisierung", Chem.–Ing.–Tech. 60 (1988) No. 11, pg. 815–821.

*Primary Examiner*—Wayne Langel
*Attorney, Agent, or Firm*—Young & Thompson

[57] ABSTRACT

A solution of hydride in liquid nitrogen, the hydride being one that is in gaseous phase at atmospheric pressure and ambient temperature. The concentration of hydride in the liquid nitrogen is comprised between 0.05 and 10 mol %, preferably between 0.05 and 2 mol %, and more preferably between 0.1 and 0.3 mol %. The hydride is selected from the group consisting of arsine, germane, phosphine ($PH_3$), diborane and silane ($SiH_4$) and is preferably silane. Atmospheres prepared from these solutions are useful in the thermal treatment of metals, or for surface treatment, particularly of polymeric or metallic surfaces.

6 Claims, No Drawings

5,543,127

DILUTE SOLUTION OF A HYDRIDE IN LIQUID NITROGEN

FIELD OF INVENTION

The invention relates to a solution of a hydride which is gaseous at atmospheric pressure and at ambient temperature, in liquid nitrogen.

BACKGROUND OF THE INVENTION

Gaseous mixtures of nitrogen and hydride such as silane ($SiH_4$) are used in numerous fields of application. Mixtures of nitrogen and hydride such as silane are particularly used for the production of electronic components. Gaseous mixtures of nitrogen and gaseous silane can also be used for the formation of a silica base deposit ($SiO_x$, x being less than or equal to 2) on the surface of a polymeric support or a metallic support. Processes for surface treatment of this type have particularly been described in the patent applications FR-A-2.670.506, FR-A-2.690.357 and FR 93.05063 filed Apr. 29, 1993, in the name of the applicant.

Moreover, FR-A-2.653.448 and FR-A-2.668.166, in the name of the applicant, describe the production of controlled atmospheres, in particular for metallurgical treatment, which are substantially free from oxidizing gases or vapors by injection of silane into the atmosphere wherein said treatment is practiced.

To this end, the applicant commercializes and provides in bottles, gaseous mixtures under pressure constituted by silane and an inert gas (nitrogen) in which the silane is present in a proportion of 2 to 10% by volume.

This provision of said mixtures in gaseous state has the following drawbacks:

the gaseous mixtures under pressure, ready for use, occupy a large volume. Because of this, the cost of their transportation is relative high;

the mixtures of nitrogen and a hydride such as silane, when the content of this latter is greater than 2%, are spontaneously inflammable in air and therefore present serious safety problems.

It therefore would be of interest to have a source of hydrides such as those mentioned above, easier to use and less dangerous.

The invention seeks to provide such a source avoiding all of the drawbacks mentioned above.

SUMMARY OF THE INVENTION

The invention relates to a solution of a hydride in liquid nitrogen, said hydride being selected from the group consisting of hydrides which are in gaseous phase at atmospheric pressure and ambient temperature (0° to 30° C.). The concentration of said hydride in the solution according to the invention can be comprised between 0.05 and 10 mol %, preferably comprised between 0.5 and 2 mol % and more preferably comprised between 0.1 and 0.3 mol %. When the hydride consists of silane, the concentration of the latter in the solution can preferably be about 0.2 mol % relative to the sum of the silane and the liquid nitrogen.

DETAILED DESCRIPTION OF THE INVENTION

The constituent hydrides of a solution according to the invention can be selected from the group consisting of arsine, germane, phosphine ($PH_3$), diborane, disilane or silane ($SiH_4$). In the case of the present invention, a particularly preferred hydride consists of silane ($SiH_4$). The silane in gaseous phase combusts spontaneously when its concentration in air is greater than 2 mol %. A solution according to the present invention therefore is useful above all for the transportation and augmentation of safety of such a hydride.

According to another aspect of the invention, the latter relates also to a solution as defined above, provided in a receptacle such as a container, a bottle or a reservoir of the type used for handling liquid nitrogen.

In such a receptacle, the solution in liquid phase is surmounted by a gaseous phase which is principally constituted of nitrogen containing several parts per million of hydride. This gaseous phase has no particular problem of safety or stability as to its composition, if care is taken to remove from said receptacle only the liquid phase. If the gaseous phase is withdrawn, the proportion of silane in the liquid phase is progressively raised.

It is also possible, by simultaneous extraction in regulated proportions of the liquid phase and the gaseous phase, to adjust the composition of the liquid mixture withdrawn to a desired value comprised between the hydride contents of the liquid phase and of the gaseous phase. A device comprising a mixer and a controlled valve system, for example a processor of the type of those currently used in industry, can be used for this purpose.

A solution according to the invention can be prepared by simple mixing of its constituents. Thus, mixing can be conducted of the nitrogen and the hydride, these two being in liquid phase. More preferably, a solution according to the invention can be prepared by bubbling hydride in gaseous phase into the liquid nitrogen. This hydride in gaseous phase can be used pure or in admixture with nitrogen.

A solution according to the invention, according to the nature of the hydride which it contains, can be particularly used for the production of electronic components, particularly in epitaxy, for doping or for etching of such components. Such a solution can also be used for the preparation of inert atmospheres or thermal treatment atmospheres, particularly atmospheres for the thermal treatment of metals. For this type of application, the hydride consists essentially of silane. Finally, a solution according to the invention can also be used for the treatment of surfaces, particularly surfaces of polymers or metals, for example according to the processes described in the applications for French patents mentioned above: FR-A-2.670.506, FR-A-2.690.357 and FR 93.05063, filed Apr. 29, 1993, whose disclosure is incorporated by reference into the present application.

In this type of process, the hydride constituting the solution according to the invention consists essentially of silane. These processes have for their object to impart to the treated surfaces modified chemical or physical properties. They have the particular aim of improving the wettability of the surface of a polymer such as polyethylene or polypropylene.

A solution according to the invention can be used to prepare a gaseous mixture which will be used as such in one of the applications mentioned above. Alternatively, the gaseous mixture obtained from said solution can be diluted with gaseous nitrogen so as to obtain reduced concentrations of hydride. This dilution with gaseous nitrogen can be such that the gaseous mixture constituted of the hydride and the nitrogen comprises for example 40 to 200 parts per million of said hydride.

The following examples have for their object to illustrate the present invention.

EXAMPLE 1

There are introduced 18.5 kg of silane ($SiH_4$) in pure form into a reservoir containing 10,000 liters of liquid nitrogen to obtain a mixture with 0.2 mol % silane.

The gaseous phase in equilibrium with the mixture contains several parts per million of silane. Because of this low silane content, the gaseous mixture gives rise to no safety problem.

EXAMPLE 2

Into a receptacle containing 26.7 kg of liquid nitrogen, there is bubbled a gaseous mixture of nitrogen and silane. The concentration of silane in this gaseous mixture is 1.85 mol %. The flow rate of the gaseous mixture is 30 liters per minute at standard temperature and pressure. The gaseous mixture is bubbled in until a liquid solution containing 0.63 mol % of silane is obtained, for a total mass of the mixture of 19 kg.

What is claimed is:

1. A solution of hydride in liquid nitrogen, said hydride being in gaseous phase at atmospheric pressure and ambient temperature, and being selected from the group consisting of phosphine, arisine, germane, diborane, silane and disilane.

2. A solution according to claim 1, wherein the concentration of hydride in the liquid nitrogen is comprised between 0.05 and 10 mol %.

3. A solution according to claim 1, wherein the concentration of said hydride in the liquid nitrogen is comprised between 0.05 and 2 mol %.

4. A solution according to claim 1, wherein the concentration of said hydride in the liquid nitrogen is comprised between 0.1 and 0.3 mol %.

5. A solution according to claim 1, in a receptacle containing liquid nitrogen.

6. A solution according to claim 5, characterized in that the hydride is silane ($SiH_4$).

* * * * *